(12) United States Patent
Engels et al.

(10) Patent No.: US 10,505,522 B1
(45) Date of Patent: Dec. 10, 2019

(54) FLIP-FLOP WITH A METAL PROGRAMMABLE INITIALIZATION LOGIC STATE

(71) Applicant: STMicroelectronics SA, Montrouge (FR)

(72) Inventors: Sylvain Engels, Meylan (FR); Alain Aurand, La Chapelle du Bard (FR); Etienne Maurin, Seyssins (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 16/152,691

(22) Filed: Oct. 5, 2018

(51) Int. Cl.
| | |
|---|---|
| *H03K 3/356* | (2006.01) |
| *H01L 27/02* | (2006.01) |
| *H03K 3/3562* | (2006.01) |
| *H03K 19/0948* | (2006.01) |
| *H01L 23/528* | (2006.01) |

(52) U.S. Cl.
CPC ...... *H03K 3/356113* (2013.01); *H01L 23/528* (2013.01); *H01L 27/0207* (2013.01); *H03K 3/3562* (2013.01); *H03K 19/0948* (2013.01)

(58) Field of Classification Search
CPC .......... H03K 3/356113; H03K 3/3562; H03K 19/0948; H01L 23/528; H01L 27/0207
See application file for complete search history.

(56) References Cited

U.S. PATENT DOCUMENTS

| | | |
|---|---|---|
| 4,649,413 A | 3/1987 | Kelly |
| 6,902,957 B2 | 6/2005 | Wang et al. |
| 7,930,670 B2 * | 4/2011 | Cox .................. H03K 19/1733 326/41 |
| 8,159,265 B1 | 4/2012 | Madurawe |
| 8,159,266 B1 | 4/2012 | Madurawe |
| 8,159,268 B1 | 4/2012 | Madurawe |
| 8,832,626 B2 | 9/2014 | Agrawal et al. |
| 9,083,325 B2 | 7/2015 | Datta et al. |
| 9,564,881 B2 | 2/2017 | Ye et al. |
| 9,811,628 B1 | 11/2017 | Park et al. |

* cited by examiner

*Primary Examiner* — Daniel C Puentes
(74) *Attorney, Agent, or Firm* — Crowe & Dunlevy (57) ABSTRACT

A standard cell layout for a flip-flop includes a flip-flop circuit and an initialization circuit. Metallization levels over the standard cell layout support circuit interconnections. At least one metallization level is provided for metal programming of an initialization configuration of the flip-flop. The at least one metallization level may have: a first wiring layout for interconnecting the initialization circuit to the flip-flop circuit for configuration programming of the flip-flop as an initialization in reset device (assertion of an initialization signal causing the flip-flop data output to be reset), or a second wiring layout for interconnecting the initialization circuit to the flip-flop circuit for configuration programming of the flip-flop as an initialization in set device (assertion of the initialization signal causing the flip-flop data output to be set).

17 Claims, 6 Drawing Sheets

| INI | CK | D | Q | QB |
|---|---|---|---|---|
| 0 | X | X | 0 | 1 |
| 1 | ↑ | 0 | 0 | 1 |
| 1 | ↑ | 1 | 1 | 0 |

FIG. 6A

| INI | CK | D | Q | QB |
|---|---|---|---|---|
| 0 | X | X | 1 | 0 |
| 1 | ↑ | 0 | 0 | 1 |
| 1 | ↑ | 1 | 1 | 0 |

… # FLIP-FLOP WITH A METAL PROGRAMMABLE INITIALIZATION LOGIC STATE

TECHNICAL FIELD

The present invention relates to register circuits formed by flip-flops and, in particular, to a flip-flop having a metal programmable initialization logic state for use in a register circuit.

BACKGROUND

It is known in the art to form a multi-bit data register circuit from a plurality of flip-flops. In particular, it is common to use D flip-flops for each bit of the multi-bit data register circuit. In certain circuit implementations, it is important for a certain data value (logic "1" or logic "0") to be stored by a flip-flop of the register in response to an initialization operation. The implementation of this functional feature typically requires the presence of additional logic circuitry operating in cooperation with the flip-flop. However, this additional logic circuitry occupies valuable space and consumes power. There is accordingly a need in the art to address the foregoing concerns.

SUMMARY

In an embodiment, a flip-flop comprises: a standard cell layout including transistors forming a flip-flop circuit and initialization circuit transistors; and a plurality of metallization levels over the standard cell layout, wherein said plurality of metallization levels includes at least one metallization level for metal programming of an initialization configuration of the flip-flop, wherein said at least one metallization level comprises: a first wiring layout for interconnecting the initialization circuit transistors to the transistors forming the flip-flop circuit if the flip-flop is to be configured as an initialization in reset device where the flip-flop responds to assertion of an initialization signal to reset a data output of the flip-flop to a first logic state; and a second wiring layout for interconnecting the initialization circuit transistors to the transistors forming the flip-flop circuit if the flip-flop is to be configured as an initialization in set device where the flip-flop responds to assertion of the initialization signal to set the data output of the flip-flop to a second logic state.

In an embodiment, a flip-flop comprises: a flip-flop circuit; initialization circuit transistors; a first wiring layout for interconnecting the initialization circuit transistors to the transistors forming the flip-flop circuit if the flip-flop is to be configured as an initialization in reset device where the flip-flop responds to assertion of an initialization signal to reset a data output of the flip-flop to a first logic state; and a second wiring layout for interconnecting the initialization circuit transistors to the transistors forming a flip-flop circuit if the flip-flop is to be configured as an initialization in set device where the flip-flop responds to assertion of the initialization signal to set the data output of the flip-flop to a second logic state.

In an embodiment, a multi-bit data register comprises: a plurality of flip-flops; wherein each flip-flop comprises: a flip-flop circuit; and initialization circuit transistors; wherein first ones of the plurality of flip-flops are metal programmed as initialization in reset devices by a first wiring layout for interconnecting the initialization circuit transistors to the transistors so that the first ones of the plurality of flip-flops respond to assertion of an initialization signal to reset a data output of each first one of the plurality of flip-flops to a first logic state; and wherein second ones of the plurality of flip-flops are metal programmed as initialization in set devices by a second wiring layout for interconnecting the initialization circuit transistors to the transistors so that the second ones of the plurality of flip-flops respond to assertion of the initialization signal to reset the data output of each second one of the plurality of flip-flops to a second logic state.

BRIEF DESCRIPTION OF THE DRAWINGS

For a better understanding of the embodiments, reference will now be made by way of example only to the accompanying figures in which.

DETAILED DESCRIPTION

Figure 1:
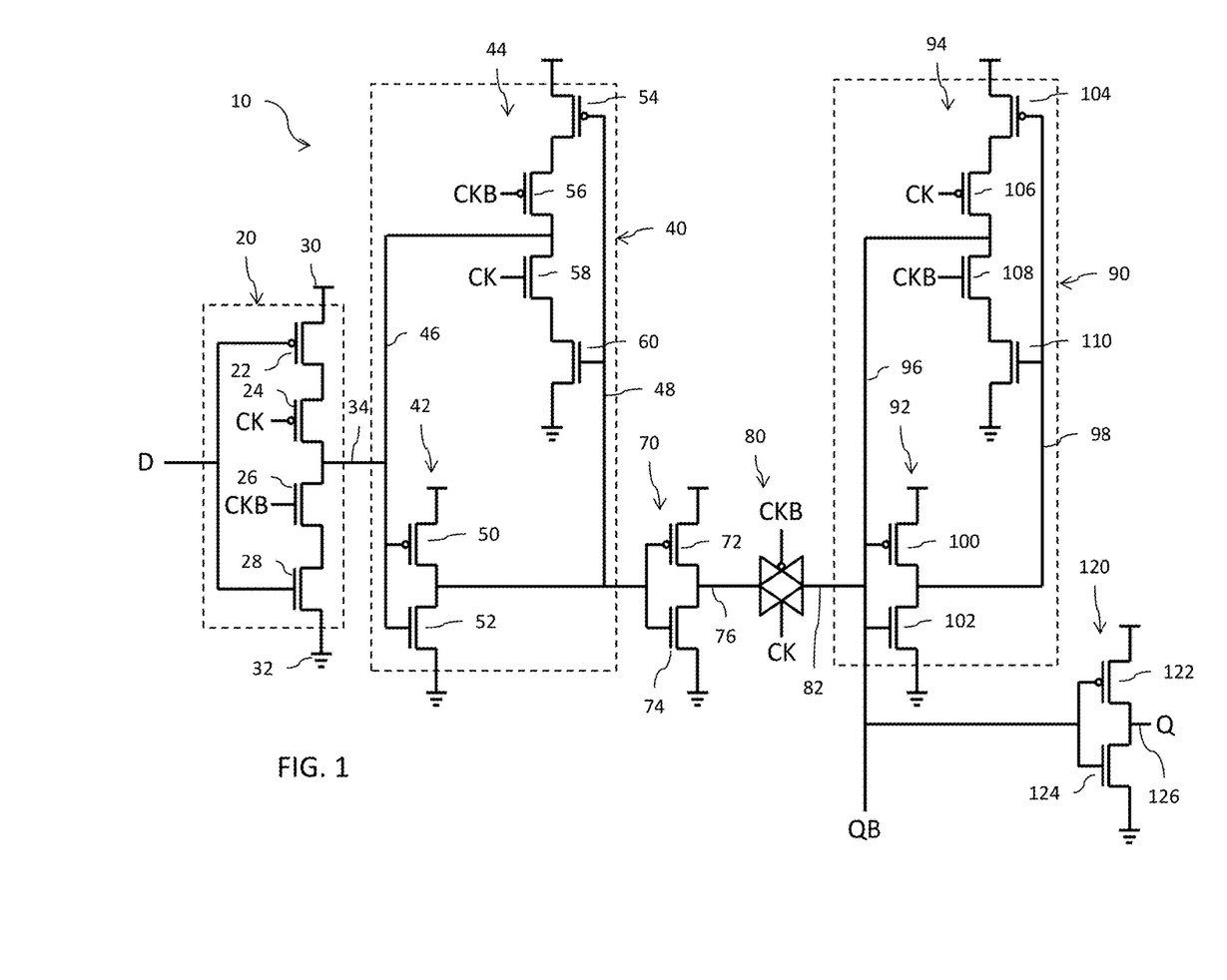
FIG. 1 is a circuit diagram of a CMOS D flip-flop.

Reference is now made to FIG. 1 showing a circuit diagram of a complementary metal oxide semiconductor (CMOS) D flip-flop 10. The D flip-flop 10 has a data input D and complementary data outputs Q and QB. The D flip-flop 10 further has a clock input configured to receive a clock signal CK (which has a corresponding logically inverted clock signal CKB generated by a logic inverter (not shown) within the flip-flop).

A clocked inverter circuit 20 has an input connected to the data input D. The clocked inverter circuit 20 includes a p-channel metal oxide semiconductor field effect transistor (MOSFET) 22, a p-channel MOSFET 24, an n-channel MOSFET 26 and an n-channel MOSFET 28. The source-drain paths of the transistors 22, 24, 26 and 28 are connected in series with each other between a positive supply node 30 and ground 32. The source of transistor 22 is connected to positive supply node 30 and the source of transistor 28 is connected to ground 32. The drains of transistors 24 and 26 are connected at the output of the clocked inverter circuit 20 to node 34. The gates of transistors 22 and 28 are connected to the data input D. The gates of the transistors 24 and 26 are connected, respectively, to receive the clock signals CK and CKB.

The clocked inverter circuit 20 responds to the clock signal CK at logic "0" and the clock signal CKB at logic "1" by inverting the logic state of the signal at the data input D for output at node 34. When the clock signal CK is at logic "1" and the clock signal CKB is at logic "0", the clocked inverter circuit 20 is disabled and node 34 is in a high-impedance state.

The D flip-flop 10 further includes a clocked master latch circuit 40. The master latch is formed by an inverter circuit 42 and a clocked inverter circuit 44. The input of the inverter circuit 42 is connected to the output of the clocked inverter circuit 44 at a first data storage node 46, and the input of the clocked inverter circuit 44 is connected to the output of the inverter circuit 42 at a second data storage node 48. The first data storage node 46 is connected to the output of the clocked inverter circuit 20 at node 34.

The inverter circuit 42 includes a p-channel MOSFET 50 and an n-channel MOSFET 52. The source-drain paths of the transistors 50 and 52 are connected in series with each other between the positive supply node 30 and ground 32. The source of transistor 50 is connected to positive supply node 30 and the source of transistor 52 is connected to ground 32. The drains of transistors 50 and 52 are connected to the second data storage node 48. The gates of transistors 50 and 52 are connected to the first data storage node 46.

The clocked inverter circuit 44 includes a p-channel MOSFET 54, a p-channel MOSFET 56, an n-channel MOSFET 58 and an n-channel MOSFET 60. The source-drain paths of the transistors 54, 56, 58 and 60 are connected in series with each other between the positive supply node 30 and ground 32. The source of transistor 54 is connected to positive supply node 30 and the source of transistor 60 is connected to ground 32. The drains of transistors 56 and 58 are connected to the first data storage node 46. The gates of transistors 54 and 60 are connected to the second data storage node 48. The gates of the transistors 56 and 58 are connected, respectively, to receive the clock signals CKB and CK.

The clocked master latch circuit 40 operates to store the logic state of the signal output from the clocked inverter circuit 20 and its complement, respectively, at the first data storage node 46 and the second data storage node 48 when the clock signal CK transitions from logic "0" to logic "1" (and correspondingly, the clock signal CKB transitions to logic "0"). In this condition, the clocked inverter circuit 44 is enabled for operation and the feedback loop within the clocked master latch circuit 40 is operational. Thus, the clocked master latch circuit 40 is triggered for latching operation by the leading edge of the clock signal CK.

The D flip-flop 10 further includes an inverter circuit 70 having a p-channel MOSFET 72 and an n-channel MOSFET 74. The source-drain paths of the transistors 72 and 74 are connected in series with each other between the positive supply node 30 and ground 32. The source of transistor 72 is connected to positive supply node 30 and the source of transistor 74 is connected to ground 32. The drains of transistors 72 and 74 are connected to node 76. The gates of transistors 72 and 74 are connected to the second data storage node 48. The inverter circuit 70 functions to logically invert the signal at the second data storage node 48 for output at node 76.

The D flip-flop 10 further includes a CMOS pass gate circuit 80. The pass gate circuit 80 is controlled to pass the signal at node 76 to node 82 when the clock signal CK is at logic "1" and the clock signal CKB is at logic "0". Conversely, when the clock signal CK is at logic "0" and the clock signal CKB is at logic "1", the CMOS pass gate circuit 80 is disabled and node 82 is in a high-impedance state.

The D flip-flop 10 further includes a clocked slave latch circuit 90. The slave latch is formed by an inverter circuit 92 and a clocked inverter circuit 94. The input of the inverter circuit 92 is connected to the output of the clocked inverter circuit 94 at a first data storage node 96, and the input of the clocked inverter circuit 94 is connected to the output of the inverter circuit 92 at a second data storage node 98. The first data storage node 96 is connected to the output of the CMOS pass gate circuit 80 at node 82.

The inverter circuit 92 includes a p-channel MOSFET 100 and an n-channel MOSFET 102. The source-drain paths of the transistors 100 and 102 are connected in series with each other between the positive supply node 30 and ground 32. The source of transistor 100 is connected to positive supply node 30 and the source of transistor 102 is connected to ground 32. The drains of transistors 100 and 102 are connected to the second data storage node 98. The gates of transistors 100 and 102 are connected to the first data storage node 96.

The clocked inverter circuit 94 includes a p-channel MOSFET 104, a p-channel MOSFET 106, an n-channel MOSFET 108 and an n-channel MOSFET 110. The source-drain paths of the transistors 104, 106, 108 and 110 are connected in series with each other between the positive supply node 30 and ground 32. The source of transistor 104 is connected to positive supply node 30 and the source of transistor 110 is connected to ground 32. The drains of transistors 106 and 108 are connected to the first data storage node 96. The gates of transistors 104 and 110 are connected to the second data storage node 98. The gates of the transistors 106 and 108 are connected, respectively, to receive the clock signals CK and CKB.

The clocked slave latch circuit 90 operates to store the logic state of the signal output from the CMOS pass gate circuit 80 and its complement, respectively, at the first data storage node 96 and the second data storage node 98 when the clock signal CK transitions from logic "1" to at logic "0" (and correspondingly, when the clock signal CKB transitions to logic "1"). In this condition, the clocked inverter circuit 94 is enabled for operation and the feedback loop within the clocked slave latch circuit 90 is operational. Thus, the clocked slave latch circuit 90 is triggered for latching operation by the trailing edge of the clock signal CK.

The data output Q is generated by an inverter circuit 120 having an input connected to the first data storage node 96. The inverter circuit 120 includes a p-channel MOSFET 122 and an n-channel MOSFET 124. The source-drain paths of the transistors 122 and 124 are connected in series with each other between the positive supply node 30 and ground 32. The source of transistor 122 is connected to positive supply node 30 and the source of transistor 124 is connected to ground 32. The drains of transistors 122 and 124 are connected to node 126 forming the data output Q. The gates of transistors 122 and 124 are connected to the first data storage node 96. The complementary data output QB may be generated at the first data storage node 96 or by logically inverting the data output Q using an inverter circuit.

Figure 2A:
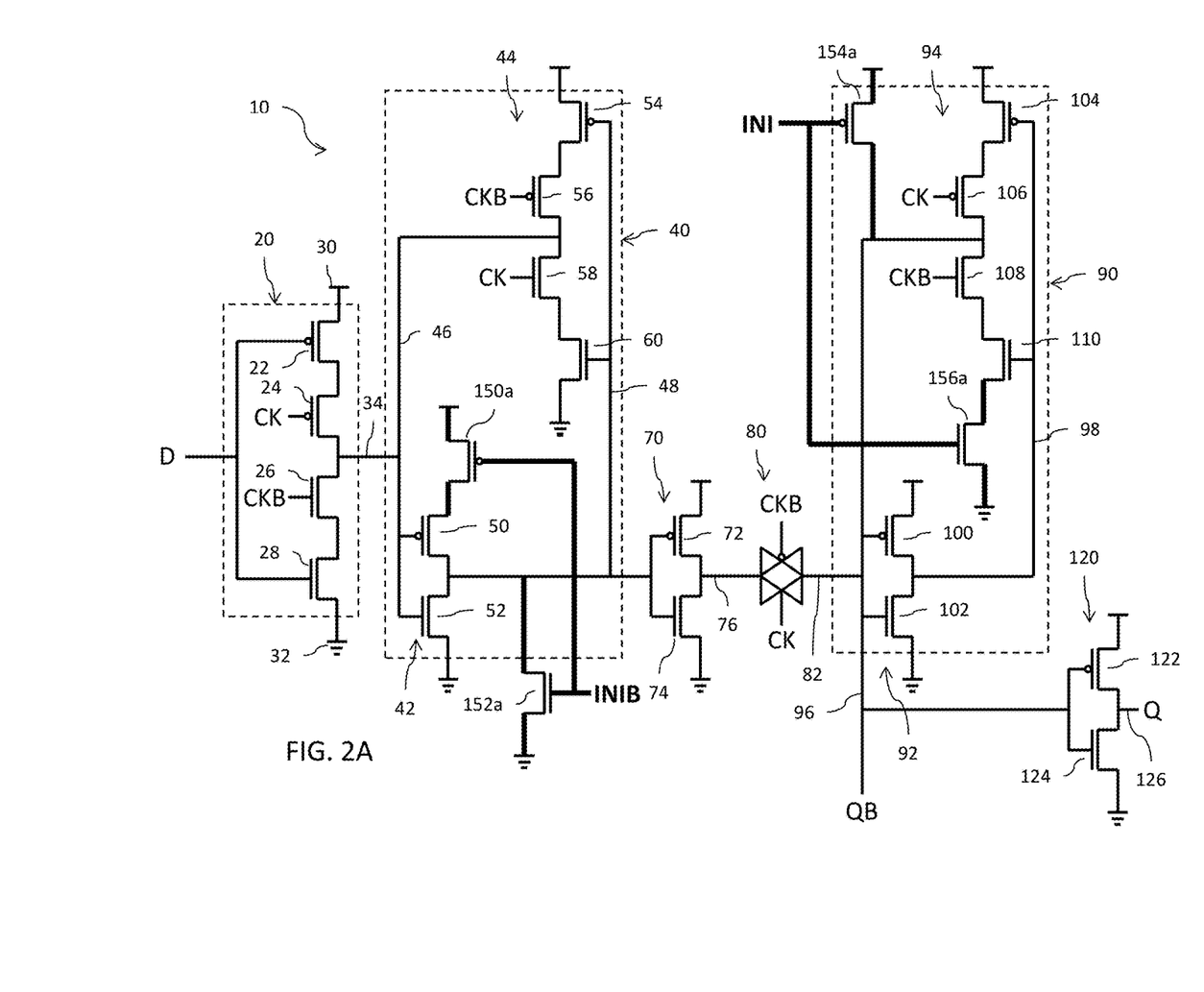
FIG. 2A is a circuit diagram of a CMOS D flip-flop including circuitry for initialization of the stored data value in a first logic state (reset)

Reference is now made to FIG. 2A showing a circuit diagram of a CMOS D flip-flop 10 including circuitry for initialization of the stored data value in a first logic state (reset). Like reference numbers refer to same components as previously described in connection with FIG. 1. The flip-flop 10 of FIG. 2A differs from the flip-flop 10 of FIG. 1 with respect to the additional circuitry for initialization of the data value stored by the flip-flop in a particular logic state. In this case, the additional circuitry for initialization responds to complementary initialization signals INI and INIB to cause the second data storage node 48 of the clocked master latch circuit 40 and the first data storage node 96 of the clocked slave latch circuit 90 to store a logic "0" data value and a logic "1" data value, respectively. In this condition, the data output Q will then be in the logic "0" state (i.e., the reset state) due to the operation of the inverter circuit 120, and so initialization here is also referred to as "resetting" the data value of the flip-flop 10.

The additional circuitry for initialization includes a p-channel MOSFET 150a and an n-channel MOSFET 152a within the clocked master latch circuit 40. The p-channel MOSFET 150a has its source-drain path connected in series with the source-drain paths of the transistors 50 and 52 between the positive supply node 30 and ground 32. In particular, the source of transistor 150a is connected to the positive supply node 30 and the drain of transistor 150a is connected to the source of transistor 50. The n-channel MOSFET 152a has its source-drain path connected between the second data storage node 48 and ground 32. The gates of the transistors 150a and 152a are connected to receive the complementary initialization signal INIB.

The additional circuitry for initialization further includes a p-channel MOSFET 154a and an n-channel MOSFET 156a within the clocked slave latch circuit 90. The p-channel MOSFET 154a has its source-drain path connected between the positive supply node 30 and the first data storage node 96. The n-channel MOSFET 156a has its source-drain path connected in series with the source-drain paths of the transistors 104, 106, 108 and 110 between the positive supply node 30 and ground 32. In particular, the source of transistor 156a is connected to ground 32 and the drain of transistor 156a is connected to the source of transistor 110. The gates of the transistors 154a and 156a are connected to receive the initialization signal INI.

When initialization signal INI is asserted at logic "0" (and thus initialization signal INIB is logic "1"), the transistor 150a is turned off, the transistor 152a is turned on, transistor 154a is turned on and transistor 156a is turned off. With transistor 150a turned off, the inverter 42 formed by transistors 50 and 52 is disabled. Because transistor 152a is turned on, the second data storage node 48 of the clocked master latch circuit 40 is connected to ground 32 and thus is reset to the logic state "0". This logic state "0" is inverted by inverter 70 to a logic state "1" which is passed by pass gate 80 to the first data storage node 96 of the clocked slave latch circuit 90. With the transistor 156a turned off, the inverter formed by transistors 104, 106, 108 and 110 is disabled. Because transistor 154a is turned on, the first data storage node 96 of the clocked slave latch circuit 90 is connected to the positive supply node 30 and set to the logic state "1". The data output Q is thus in the logic state "0" due to the operation of inverter 120 and the D flip-flop is reset.

Conversely, when initialization signal INI is logic "1" (and thus initialization signal INIB is logic "0"), the transistor 150a is turned on, the transistor 152a is turned off, transistor 154a is turned off and transistor 156a is turned on. The pull-down and pull-up functions of the transistors 152a and 154a are accordingly disabled, and the inverter 42 and clocked inverter circuit 94 are both enabled for operation. The clocked master latch circuit 40 and clocked slave latch circuit 90 will accordingly operate normally as described above in connection with FIG. 1.

Figure 2B:
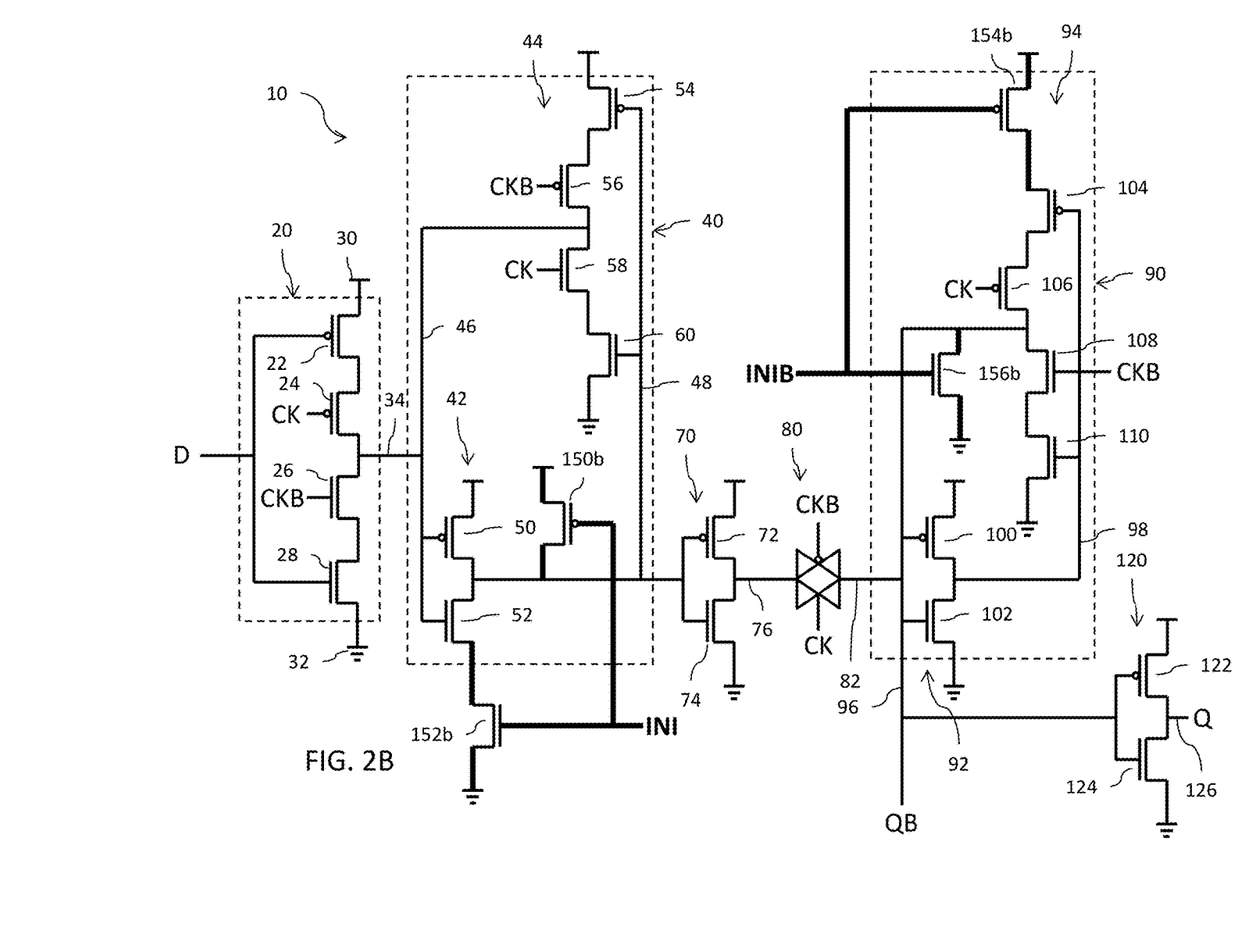
FIG. 2B is a circuit diagram of a CMOS D flip-flop including circuitry for initialization of the stored data value in a second logic state (set)

Reference is now made to FIG. 2B showing a circuit diagram of a CMOS D flip-flop 10 including circuitry for initialization of the stored data value in a second logic state (set). Like reference numbers refer to same components as previously described in connection with FIG. 1. The flip-flop 10 of FIG. 2B differs from the flip-flop 10 of FIG. 1 with respect to the additional circuitry for initialization of the data value stored by the flip-flop in a particular logic state. In this case, the additional circuitry for initialization responds to the complementary initialization signals INI and INIB to cause the second data storage node 48 of the clocked master latch circuit 40 and first data storage node 96 of the clocked slave latch circuit 90 to store a logic "1" data value and a logic "0" data value, respectively. In this condition, the data output Q will be in the logic "1" state (i.e., the set state) due to the operation of the inverter circuit 120, and so initialization here is also referred to as "setting" the data value of the flip-flop 10.

The additional circuitry for initialization includes a p-channel MOSFET 150b and an n-channel MOSFET 152b within the clocked master latch circuit 40. The p-channel MOSFET 150b has its source-drain path connected between the positive supply node 30 and the second data storage node 48. The n-channel MOSFET 152b has its source-drain path connected in series with the source-drain paths of the transistors 50 and 52 between the positive supply node 30 and ground 32. In particular, the source of transistor 152b is connected to ground 32 and the drain of transistor 152b is connected to the source of transistor 52. The gates of the transistors 150b and 152b are connected to receive the initialization signal INI.

The additional circuitry for initialization further includes a p-channel MOSFET 154b and an n-channel MOSFET 156b within the clocked slave latch circuit 90. The p-channel MOSFET 154b has its source-drain path connected in series with the source-drain paths of the transistors 104, 106, 108 and 110 between the positive supply node 30 and ground 32. In particular, the source of transistor 154b is connected to the positive supply node 30 and the drain of transistor 154b is connected to the source of transistor 104. The n-channel MOSFET 156b has its source-drain path connected between the first data storage node 96 and ground 32. The gates of the transistors 154b and 156b are connected to receive the complementary initialization signal INIB.

When initialization signal INI is asserted to logic "0" (and thus initialization signal INIB is logic "1"), the transistor 150b is turned on, the transistor 152b is turned off, transistor 154b is turned off and transistor 156a is turned on. With transistor 152b turned off, the inverter 42 formed by transistors 50 and 52 is disabled. Because transistor 150b is turned on, the second data storage node 48 of the clocked master latch circuit 40 is connected to the positive supply node 30 and thus set to the logic state "1". This logic state "1" is inverted by inverter 70 to a logic state "0" which is passed by pass gate 80 to the first data storage node 96 of the clocked slave latch circuit 90. With the transistor 154b turned off, the inverter formed by transistors 104, 106, 108 and 110 is disabled. Because transistor 156b is turned on, the first data storage node 96 of the clocked slave latch circuit 90 is connected to ground 32 and reset to the logic state "0". The data output Q is thus in the logic state "1" due to the operation of the inverter 120 and the D flip-flop is set.

Conversely, when initialization signal INI is logic "1" (and thus initialization signal INIB is logic "0"), the transistor 150b is turned off, the transistor 152b is turned on, transistor 154b is turned on and transistor 156a is turned off. The pull-up and pull-down functions of the transistors 150b and 156b are accordingly disabled, and the inverter 42 and clocked inverter circuit 94 are both enabled for operation. The clocked master latch circuit 40 and clocked slave latch circuit 90 will accordingly operate normally as described above in connection with FIG. 1.

Figure 3:
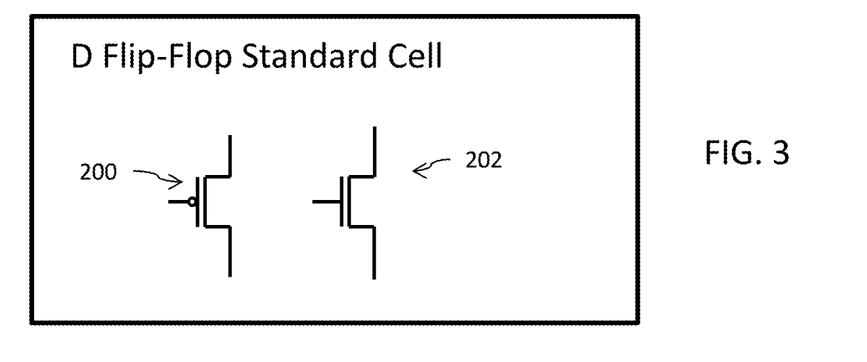
FIG. 3 schematically illustrates a standard cell layout of the transistors for the D-flip-flop.

It will be noted, with reference to FIGS. 2A and 2B, that the flip-flop 10, whether implemented as an initialization in reset configuration device or initialization in set configuration device, has the same number of transistor devices. The only difference between the configurations is in the electrical connection of the transistors 150, 152, 154 and 156 of the respective additional circuitry for initialization to the transistors and power supply nodes 30 and 32 of the clocked master latch circuit 40 and clocked slave latch circuit 90 (compared thicker wiring lines of FIGS. 2A-2B). Because of this, a standard cell layout including all necessary transistors (p-channel MOSFETs 200 and n-channel MOSFETs 202) can be designed. FIG. 3 schematically illustrates such a standard cell layout for the D flip-flop 10. It will be understood that this schematic illustrations shows transistors 200 and 202 as being representative of the transistors 22, 24, 26, 28, 50, 52, 54 56, 58, 60, 72, 74, 100, 102, 104, 106, 108, 110, 122 and 124 and pass gate 80 which are included in the D-flip-flop 10. The transistors 200 and 202 are further representative of the transistors 150, 152, 154 and 156 of the additional circuitry for initialization of the D flip-flop. The actual layout of all these transistors for the standard cell of the D flip-flop is not explicitly shown as the precise arrangement of the transistors can take on numerous forms. Those skilled in the art are capable of designing the layout of the necessary transistors to provide the standard cell.

Figure 4A:
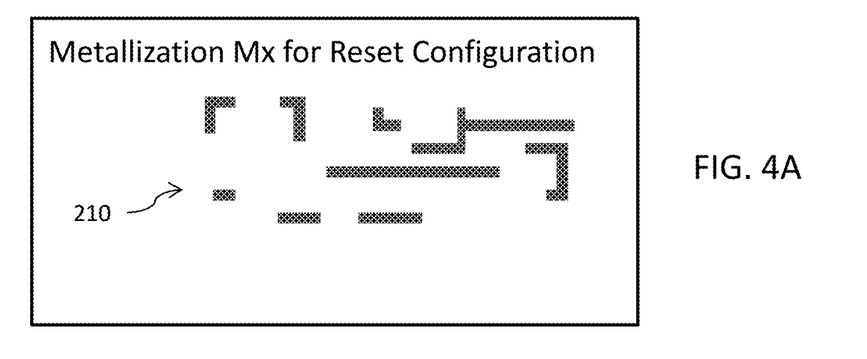
FIG. 4A is an example layout of a metallization layer for use with the standard cell layout of FIG. 3 to provide the D flip-flop with reset initialization functionality.
Figure 4B:
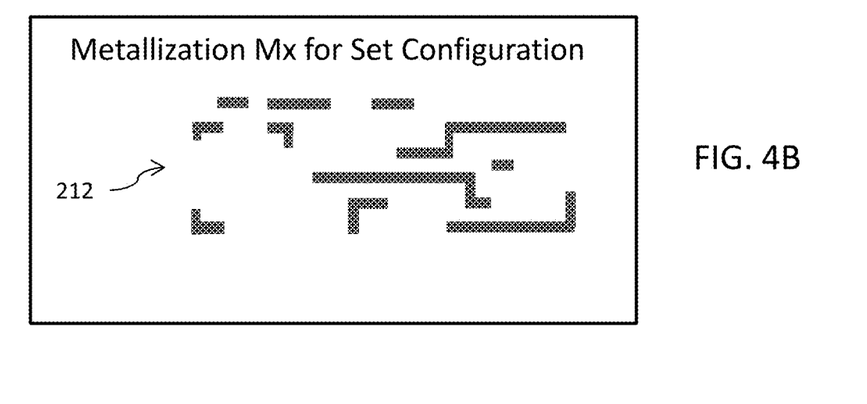
FIG. 4B is an example layout of a metallization layer for use with the standard cell layout of FIG. 3 to provide the D flip-flop with set initialization functionality.

The initialization configuration of the D flip-flop 10 as either a reset configuration device or a set configuration device is metal programmable. By this it is meant that a different arrangement of metallization connections is provided for the D flip-flop dependent on whether the D flip-flop is to operate as an initialization in reset device (see, FIG. 2A) or an initialization in set device (see, FIG. 2B). FIG. 4A illustrates an example of a wiring layout for metallization level Mx in order to configure the standard cell layout of FIG. 3 for the D flip-flop as an initialization in reset device. The metal lines 210 and the via connections (not explicitly shown) of metallization level Mx in FIG. 4A provide the wiring interconnections to configure the transistors 150, 152, 154 and 156 of the additional circuitry (with connections as transistors 150a, 152a, 154a and 156a) for initialization as shown in FIG. 2A so as to configure the standard cell layout of FIG. 3 for the D flip-flop as an initialization in reset device. These particular wiring interconnections correspond to the thicker line widths for the gate, source and drain connections for the transistors 150a, 152a, 154a and 156a as shown in FIG. 2A. The metal lines 212 and the via connections (not explicitly shown) of metallization level Mx in FIG. 4B provide the wiring interconnections to configure the transistors 150, 152, 154 and 156 of the additional circuitry (with connections as transistors 150b, 152b, 154b and 156b) for initialization as shown in FIG. 2B so as to configure the standard cell layout of FIG. 3 for the D flip-flop as an initialization in set device. These particular wiring interconnections correspond to the thicker line widths for the gate, source and drain connections for the transistors 150b, 152b, 154b and 156b as shown in FIG. 2B.

Figure 5:
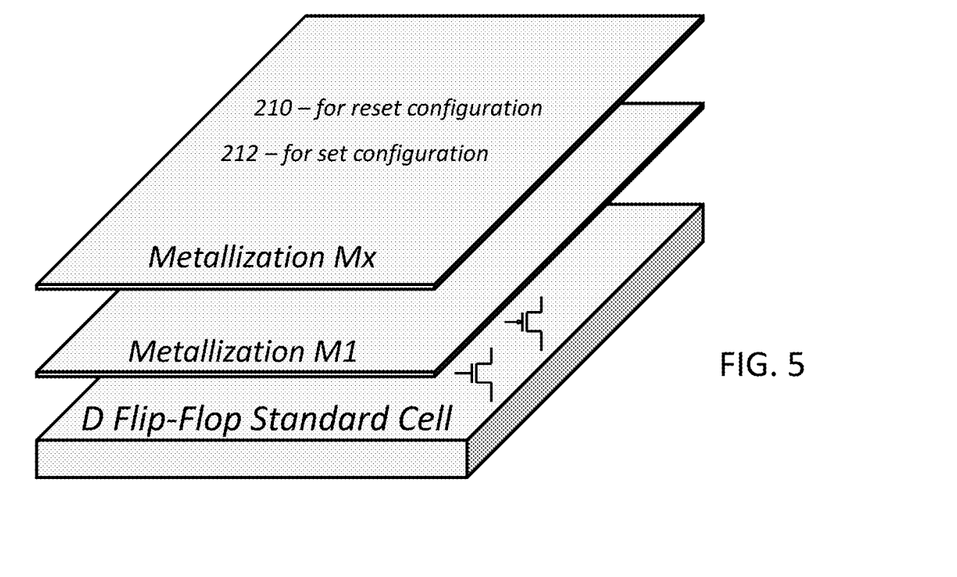
FIG. 5 shows the arrangement of the metallization level Mx over the standard cell layout.

FIG. 5 shows the arrangement of metallization levels including the metallization level Mx over the standard cell layout. The metallization level Mx is one of many included metallization levels (such as, including, metallization level M1). If the arrangement of the metal lines 210 for the metallization level Mx is as shown in FIG. 4A, the D flip-flop will be an initialization in reset device. Conversely, if the arrangement of the metal lines 212 for the metallization level Mx is as shown in FIG. 4B, the D flip-flop will be an initialization in set device.

Figure 6A:
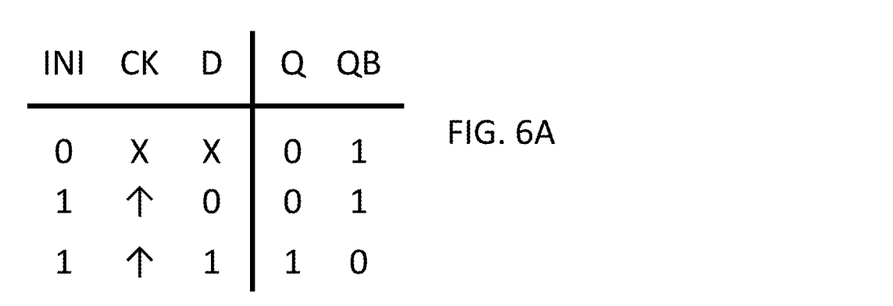
FIGS. 6A and 6B show truth tables for operation of the D flip-flop.

FIG. 6A illustrates the truth table for operation of the D flip-flop 10 when configured as an initialization in reset device using the standard cell layout of FIG. 3 and the metallization level Mx in FIG. 4A (producing a circuit as shown in FIG. 2A). When the initialization signal INI is forced logic low (logic "0"), the logic states of the clock CK and data input D are "don't care". The turn on of the transistors 152a and 154a will cause the data output Q to logic "0" and the complementary data output QB to logic "1". When the initialization signal INI is logic high (logic "1"), the D flip-flop operates in a standard manner. Responsive to the positive edge of the clock CK the logic value of the data input D is transferred to the data output Q (and the complement of the logic value of the data input D is transferred to the complementary data output QB).

Figure 6B:
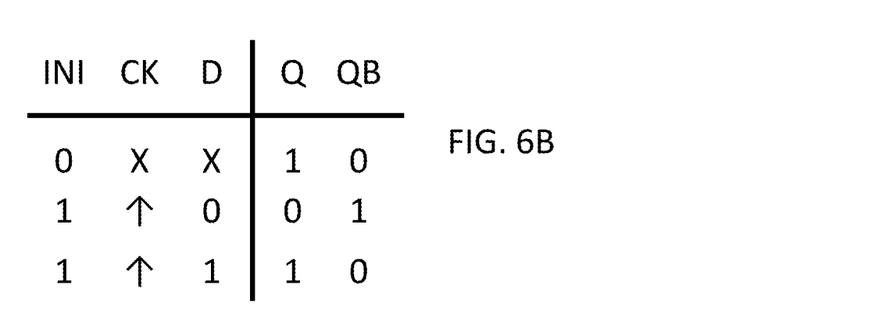

FIG. 6B illustrates the truth table for operation of the D flip-flop 10 when configured as an initialization in set device using the standard cell layout of FIG. 3 and the metallization level Mx in FIG. 4B (producing a circuit as shown in FIG. 2B). When the initialization signal INI is forced logic low (logic "0"), the logic states of the clock CK and data input D are not relevant. The turn on of the transistors 150b and 156b will cause the data output Q to logic "1" and the complementary data output QB to logic "0". When the initialization signal INI is logic high (logic "1"), the D flip-flop operates in a standard manner. Responsive to the positive edge of the clock CK the logic value of the data input D is transferred to the data output Q (and the complement of the logic value of the data input D is transferred to the complementary data output QB).

Figure 7:
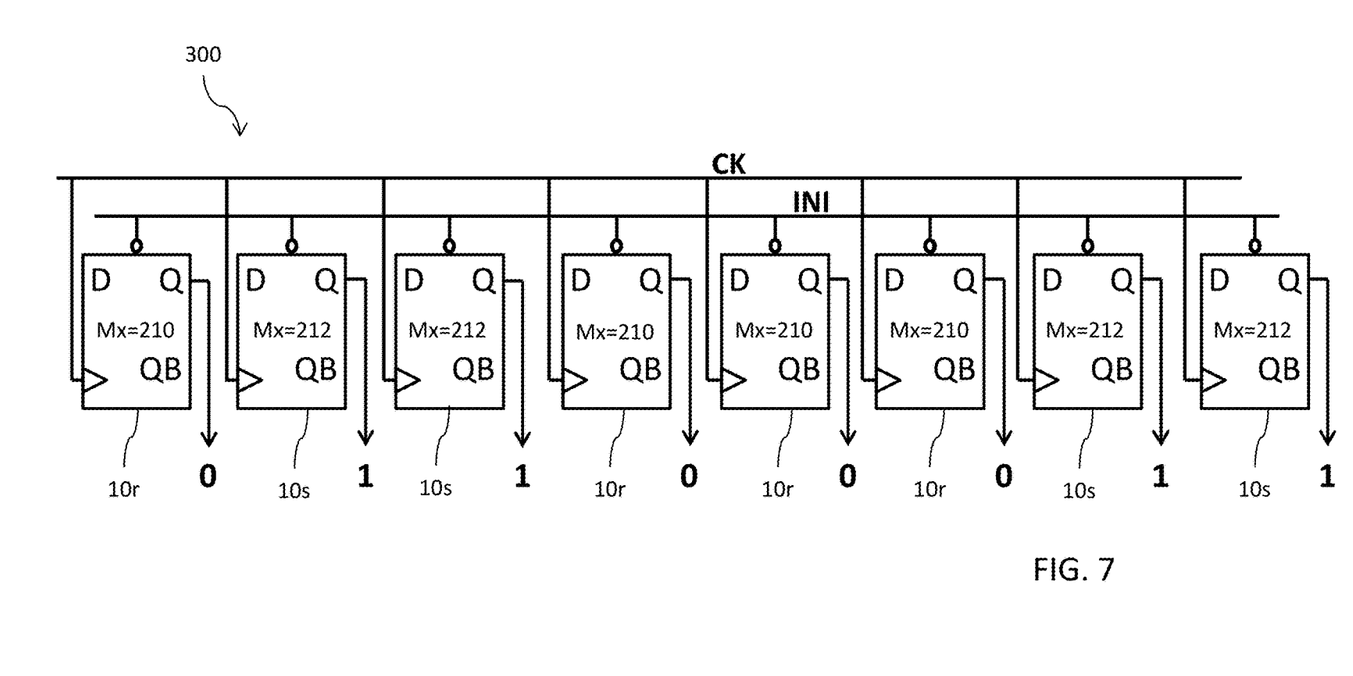
FIG. 7 is a block diagram of a multi-bit data register formed by metal programmable D flip-flops.

FIG. 7 is a circuit diagram of a multi-bit data register 300 including a plurality of D flip-flops 10. Each D flip-flop 10 included in the register 300 is formed by the standard cell layout as shown in FIG. 3. Certain ones of the D flip-flops 10, indicated by reference 10r, have been fabricated to use the arrangement of the metal lines 210 for the metallization level Mx is as shown in FIG. 4A and are thus metal programmed as D flip-flops that are initialization in reset devices. Certain other ones of the D flip-flops 10, indicated by reference 10s, have been fabricated to use the arrangement of the metal lines 212 for the metallization level Mx is as shown in FIG. 4B and are thus metal programmed as D flip-flops that are initialization in set devices. The initialization signal INI is applied to the initialization input of each D flip-flop 10 of the register 300. In response to the assertion of the initialization signal INI at logic low (logic "0"), that data output Q of each D flip-flop 10r is reset to logic "0" and the data output Q of each D flip-flop 10s is set to logic "1". In the example shown in FIG. 7, the register 300 will store and output a data byte of <01100011> in response to the assertion of the initialization signal INI at logic low (logic "0"). When the initialization signal INI is subsequently deasserted (logic "1"), each D flip-flop 10 in the register 300 operates in a normal manner to latch the logic state at the data input D to the data output Q in response to the leading edge of the clock CK.

Although implementation as disclosed herein is made in the context of a D-type flip-flop, it will be understood that this is by way of example only. The metal programmable features as described are equally applicable to other types of flip-flops. The additional circuitry for initialization will be included in the standard cell design for that flip-flop, and the interconnection of that additional circuitry for initialization to latched nodes will be set by the choice of the metal wiring layout of at least one metallization level Mx.

While the invention has been illustrated and described in detail in the drawings and foregoing description, such illustration and description are considered illustrative or exemplary and not restrictive; the invention is not limited to the

What is claimed is:

1. A flip-flop, comprising:
a standard cell layout including transistors forming a flip-flop circuit and initialization circuit transistors; and
a plurality of metallization levels over the standard cell layout, wherein said plurality of metallization levels includes at least one metallization level for metal programming of an initialization configuration of the flip-flop, wherein said at least one metallization level comprises:
a first wiring layout for interconnecting the initialization circuit transistors to the transistors forming the flip-flop circuit if the flip-flop is to be configured as an initialization in reset device where the flip-flop responds to assertion of an initialization signal to reset a data output of the flip-flop to a first logic state; and
a second wiring layout for interconnecting the initialization circuit transistors to the transistors forming the flip-flop circuit if the flip-flop is to be configured as an initialization in set device where the flip-flop responds to assertion of the initialization signal to set the data output of the flip-flop to a second logic state.

2. The flip-flop of claim 1, wherein the flip-flop circuit comprises a first latch circuit including a data storage node and the initialization circuit transistors comprise:
a first transistor controlled in response to the initialization signal, wherein the first transistor is connected by the first wiring layout to the data storage node as a pull-down transistor device; and
a second transistor controlled in response to the initialization signal, wherein the second transistor is connected by the second wiring layout to the data storage node as a pull-up transistor device.

3. The flip-flop of claim 2:
wherein the first transistor is connected by the second wiring layout as a disable transistor which disables operation of an inverter circuit of the first latch circuit in response to the initialization signal; and
wherein the second transistor is connected by the first wiring layout as a disable transistor which disables operation of the inverter circuit of the first latch circuit in response to the initialization signal.

4. The flip-flop of claim 3, wherein the first latch circuit is a master latch circuit, the flip-flop circuit further including a slave latch circuit having an input coupled to an output of the master latch circuit.

5. The flip-flop of claim 1, wherein the flip-flop circuit comprises a second latch circuit including a data storage node and the initialization circuit transistors comprise:
a third transistor controlled in response to the initialization signal wherein the third transistor is connected by the first wiring layout to the data storage node as a pull-up transistor device; and
a fourth transistor controlled in response to the initialization signal wherein the second transistor is connected by the second wiring layout to the data storage node as a pull-down transistor device.

6. The flip-flop of claim 5:
wherein the third transistor is connected by the second wiring layout as a disable transistor which disables operation of an inverter circuit of the second latch circuit in response to the initialization signal; and
wherein the fourth transistor is connected by the first wiring layout as a disable transistor which disables operation of the inverter circuit of the second latch circuit in response to the initialization signal.

7. The flip-flop of claim 6, wherein the second latch circuit is a slave latch circuit, the flip-flop circuit further including a master latch circuit having an output coupled to an input of the slave latch circuit.

8. A flip-flop, comprising:
a flip-flop circuit;
initialization circuit transistors;
a first wiring layout for interconnecting the initialization circuit transistors to transistors forming the flip-flop circuit if the flip-flop is to be configured as an initialization in reset device, where the flip-flop responds to assertion of an initialization signal to reset a data output of the flip-flop to a first logic state; and
a second wiring layout for interconnecting the initialization circuit transistors to transistors forming the flip-flop circuit if the flip-flop is to be configured as an initialization in set device, where the flip-flop responds to assertion of the initialization signal to set the data output of the flip-flop to a second logic state.

9. The flip-flop of claim 8, wherein the first or second wiring layout is selected by selection of a corresponding metallization wiring layer.

10. The flip-flop of claim 8, wherein the flip-flop circuit comprises a first latch circuit including a data storage node and the initialization circuit transistors comprise:
a first transistor controlled in response to the initialization signal, wherein the first transistor is connected by the first wiring layout to the data storage node as a pull-down transistor device; and
a second transistor controlled in response to the initialization signal, wherein the second transistor is connected by the second wiring layout to the data storage node as a pull-up transistor device.

11. The flip-flop of claim 10:
wherein the first transistor is connected by the second wiring layout as a disable transistor which disables operation of an inverter circuit of the first latch circuit in response to the initialization signal; and
wherein the second transistor is connected by the first wiring layout as a disable transistor which disables operation of the inverter circuit of the first latch circuit in response to the initialization signal.

12. The flip-flop of claim 11, wherein the first latch circuit is a master latch circuit, the flip-flop circuit further including a slave latch circuit having an input coupled to an output of the master latch circuit.

13. The flip-flop of claim 8, wherein the flip-flop circuit comprises a second latch circuit including a data storage node and the initialization circuit transistors comprise:
a third transistor controlled in response to the initialization signal, wherein the third transistor is connected by the first wiring layout to the data storage node as a pull-up transistor device; and
a fourth transistor controlled in response to the initialization signal, wherein the second transistor is connected by the second wiring layout to the data storage node as a pull-down transistor device.

14. The flip-flop of claim 13:
wherein the third transistor is connected by the second wiring layout as a disable transistor which disables operation of an inverter circuit of the second latch circuit in response to the initialization signal; and wherein the fourth transistor is connected by the first wiring layout as a disable transistor which disables operation of the inverter circuit of the second latch circuit in response to the initialization signal.

15. The flip-flop of claim 14, wherein the second latch circuit is a slave latch circuit, the flip-flop circuit further including a master latch circuit having an output coupled to an input of the slave latch circuit.

16. The multi-bit data register of claim 8, wherein the first or second wiring layout is selected by selection of a corresponding metallization wiring layer.

17. A multi-bit data register, comprising:
a plurality of flip-flops;
wherein each flip-flop comprises:
a flip-flop circuit; and
initialization circuit transistors;

wherein first ones of the plurality of flip-flops are metal programmed as initialization in reset devices by a first wiring layout for interconnecting the initialization circuit transistors to transistors forming the flip-flop circuit so that the first ones of the plurality of flip-flops respond to assertion of an initialization signal to reset a data output of each first one of the plurality of flip-flops to a first logic state; and wherein second ones of the plurality of flip-flops are metal programmed as initialization in set devices by a second wiring layout for interconnecting the initialization circuit transistors to transistors forming the flip-flop circuit so that the second ones of the plurality of flip-flops respond to assertion of the initialization signal to reset the data output of each second one of the plurality of flip-flops to a second logic state.

* * * * *